United States Patent [19]

Saito et al.

[11] Patent Number: 4,704,318

[45] Date of Patent: Nov. 3, 1987

[54] PRINT CIRCUIT BOARD

[75] Inventors: Masayuki Saito, Yokohama; Hirosi Oodaira, Chigasaki, both of Japan

[73] Assignee: Kabushiki Kaisha Toshiba, Kawasaki, Japan

[21] Appl. No.: 838,823

[22] Filed: Mar. 12, 1986

[30] Foreign Application Priority Data

Mar. 14, 1985 [JP] Japan .................................. 60-49303
Mar. 14, 1985 [JP] Japan .................................. 60-49304

[51] Int. Cl.⁴ ...................... B32B 3/00; B32B 15/08; B32B 27/32; H05K 1/00
[52] U.S. Cl. .................................. 428/209; 428/462; 428/521; 428/901; 174/68.5
[58] Field of Search ............... 428/462, 521, 901, 209; 174/68.5

[56] References Cited

U.S. PATENT DOCUMENTS

| 3,704,207 | 11/1972 | Burtis . | |
| 3,947,801 | 3/1976 | Bube . | |
| 4,072,792 | 2/1978 | Araki et al. | 428/246 |
| 4,091,157 | 5/1978 | Hori et al. | 428/196 |
| 4,243,462 | 1/1981 | Hori et al. | 156/310 |
| 4,311,759 | 1/1982 | Glennon | 428/345 |
| 4,326,238 | 4/1982 | Takeda et al. | 361/386 |
| 4,499,149 | 2/1985 | Berger | 428/447 |
| 4,522,888 | 6/1985 | Eichelberger et al. | 428/546 |
| 4,568,592 | 2/1986 | Kawaguchi et al. | 428/107 |

FOREIGN PATENT DOCUMENTS

| 2295678 | 7/1976 | France . | |
| 0170946 | 10/1982 | Japan | 428/521 |
| 508057 | 11/1938 | United Kingdom | 428/521 |

OTHER PUBLICATIONS

Electronic Design, vol. 30, No. 4, Feb. 1982, pp. 209–216, Denville, US; H. Winard: "Focus on Thick Films: Base Metals and Polymers Loom Large".

Primary Examiner—John E. Kittle
Assistant Examiner—Patrick J. Ryan
Attorney, Agent, or Firm—Oblon, Fisher, Spivak, McClelland & Maier

[57] ABSTRACT

There is disclosed a wiring substrate comprising a wiring circuit pattern formed on a metal substrate with an insulating resinous layer interposed therebetween. In this wiring substrate, the insulating resinous layer is formed of a high molecular composition comprising thermosetting 1,2-polybutadiene containing 5 to 30% by weight of a high molecular softening agent such as hydrogenated polybutadiene. A method of manufacturing such a wiring substrate is also disclosed, wherein a light-reflecting pigment is included in the insulating resinous layer for the convenience of the subsequent laser trimming.

10 Claims, 13 Drawing Figures

PRINT CIRCUIT BOARD

BACKGROUND OF THE INVENTION

1. Background of the Invention

This invention relates to a print circuit substrate which has a high heat-releasing property and yet is little contaminated by noises, thereby ensuring the rapid processing of signals and more particularly to a print circuit board involving a metal core.

2. Description of the Prior Art

Recently difficulties are presented by an increase in the quantity of heat released from the individual parts of an electric circuit and their heat-releasing density due to the high integration of an electric circuit. Consequently, high heat-releasing property is demanded of a circuit substrate. Further, rapid signal processing and suppression of noises are more strongly demanded for improving the performance of electrical implements. The vital importance for the quick signal processing and the maximum elimination of noises is the low permitivity of an insulated substrate, though an electric circuit should also have as low a resistance as possible. The recent trend in manufacturing a high heat-releasing metal core type print circuit board goes toward the process of laminating sheets impregnated with epoxy resin on a metal substrate and coating the laminated mass with a copper foil or spreading resin over the surface of an anodized aluminium sheet and further pasting a copper foil over the laminated mass. The above-mentioned processes have come to be widely accepted in the fabrication of, for example, an electric circuit. However, the recently proposed metal core type print circuit board involves an insulation layer prepared from epoxy resin or anodized aluminium membrane, and consequently has as high a relative dielectric constant as about 4 to 6, thus obstructing application to a high frequency circuit or in the rapid processing of signals. To date, therefore, no metal core type print circuit board has been developed which has a lower relative dielectric constant than 3.

SUMMARY OF THE INVENTION

This invention has been accomplished in view of the drawbacks accompanying the conventional technique of manufacturing a metal core type print circuit board. To attain the above-mentioned object, the present invention provides a circuit board which effectively released heat, has a low relative dielectric constant, is little contaminated by noises, is capable of rapid signal processing, and ensures high practical adaptability.

Namely, this invention provides a circuit board which is constructed by printing an electric circuit on a metal substrate with an insulating resin layer interposed therebetween, and is characterized in that the insulating resin layer is formed of a high molecular composition prepared by adding 5 to 30% by weight (based on the whole body of the resin layer) of a high molecular softening agent to a thermosetting 1,2-polybutadiene resin.

Further, the method of the present invention for manufacturing a metal core type print wire board comprises the steps of:

(a) coating a metal substrate with a thermosetting 1,2-polybutadiene resin composition prepared from 5 to 30% by weight of hydrogenated polybutadiene resin and 2 to 50% by weight of light-reflecting pigment;

(b) selectively spreading resinous electric resistive paste over said resin composition;

(c) selectively coating resin-base metal paste to provide an electric resistive circuit;

(d) baking said electric resistive paste and metal paste in an atmosphere of nitrogen;

(e) subjecting the baked resistor to laser trimming; and (f) mounting a metal layer on a wire pattern produced by baking said metal paste.

This invention offers the advantages that the coating of polybutadiene on a metal substrate as an insulation layer which has hitherto presented difficulties can be realized; it is possible to provide an insulation layer having a lower relative dielectric constant than 3; improvement is ensured in the crystallization of nonelectrically plated substance on the metal wire pattern produced on the insulation layer; and the mechanical strength of soldered substance as sufficiently increased; and consequently it is possible to provide a print wire substrate which effectively releases heat; is little contaminated by noise; and is capable of rapidly processing signals.

DETAILED DESCRIPTION OF THE PREFERRED EMBODIMENTS

Description may now be made with reference to the accompanying drawings of a print wire board embodying the present invention.

Figure 1A:
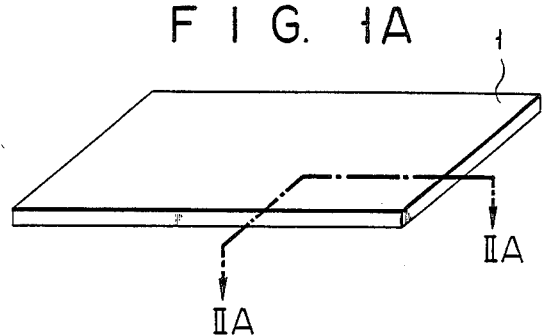
FIGS. 1A to 1F are oblique views showing the sequential steps of manufacturing a print wire board embodying this invention.
Figure 2A:
FIGS. 2A to 2F are sectional views corresponding to FIGS. 1A to 1G.

FIG. 1A and 2A represent metal substrate 1. No limitation is imposed on the kind of metal constituting said substrate 1. It is possible to use, for example, copper, iron, nickel, aluminium, and stainless steel. viewed, however, from machinability, heat release, light weight and other factors, an aluminium substrate is preferred. It is further advised to clean the surface of the substrate material by buffing, because the adhesivity of a metal material to the substrate surface is satisfactorily improved.

Figure 1B:
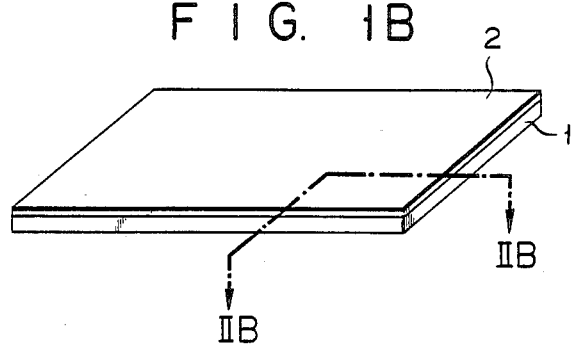
Figure 2B:
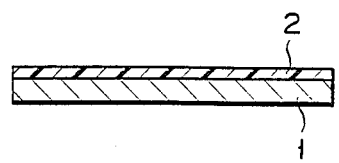

With the present invention, insulating resinous layer 2 is coated over metal substrate 1, by means of, for example, screen printing, spinner coating or dipping (FIG. 1B and FIG. 2B). Insulating resinous layer 2 is mainly composed of thermosetting 1,2-polybutadiene resin and 5 to 30% by weight or preferably 8 to 15% by weight of high molecular softening agent, and further in consideration of the subsequently applied laser trimming, 2 to 50% by weight of light-reflecting pigment.

As used herein, the high molecular softening agent is selected from the group consisting of, for example, hydrogenated polybutadiene resin, atactic polypropylene resin, chlorinated polyethylene, ethylene-vinyl acetate copolymer and vinyl acetate. The light-reflecting pigment is selected from the group consisting of metal powder suchas powder of aluminum or nickel, and white pigments such as hydrozincite, lithopone, titanium white and white lead. Further, it is possible to add a proper solvent, thixotropic agent, additives hardening agent to the aforementioned composition in order to let it be readily applied or handled.

Particularly preferred among the above-mentioned high molecular softening agents, are hydrogenated polybutadiene resin and atactic polypropylene resin which have a similar molecular structure to that of thermosetting 1,2-polybutadiene resin and consequently an excellent solubility. With this invention, the addition of a high molecular softening agent is defined to be 5 to 30% by weight. The reason is as follows.

The application of less than 5% by weight of said high molecular softening agent has the drawbacks that the thermosetting 1,2-polybutadiene resin exceedingly shrinks when thermally set; and when noticeably contracted by thermosetting, said resin which is originally hard undergoes prominent cracking and is very much deteriorated in electric properties; and the addition of more than 30% by weight of said high molecular softening agent is accompanied with the difficulties that the thermosetting 1,2-polybutadiene resin having a low cross linking density fails to be tightly adhered to an electric wire layer formed on said resin, thus giving rise to practical difficulties.

It is advised to add the light-reflecting pigment to such extent that said pigment can reflect sufficient laser beams so as to protect the insulating resin layer from being damaged during the subsequent laser trimming process.

The thermosetting 1,2-polybutadiene resin is preferred to have an average molecular weight roughly ranging between 1700 and 3300. The reason is as follows. A thermosetting 1,2-polybutadiene resin having a smaller molecular weight than 1700 is partly left in the form of unhardened oily residue even at a sufficiently high temperature to bake metal paste. Said oily residue settles on a copper pattern, thereby obstructing the crystallization of nonelectrolytically plated substance. Conversely if said thermosetting 1,2-polybutadiene resin has a larger average molecular weight than 3300, it will tend to rise in viscosity, and decrease in application. It is also advised to mix said insulting resin composition layer 2 with a hardening catalyst, for example, cumene peroxide.

Figure 1C:
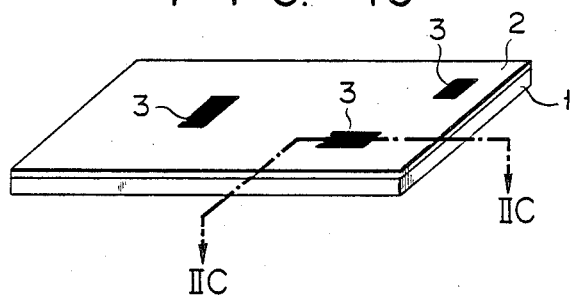
Figure 2C:
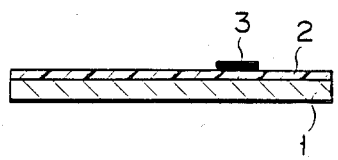

In the succeeding step, as shown in FIGS. 1C and 2C, resinous electric resistance paste 3 is selectively applied, for example, by the printing process. Resinous electric resistance paste 3 is generally prepared, for example, from phenolic resin, epoxy resin and polyimide resin respectively blended with carbon powder.

Figure 1D:
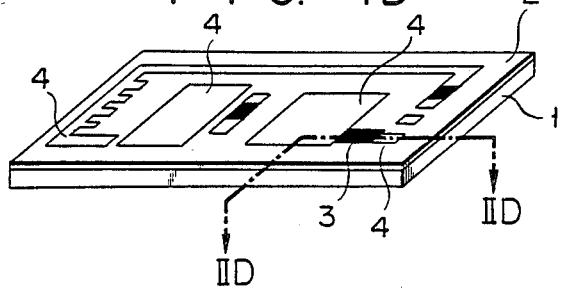
Figure 2D:
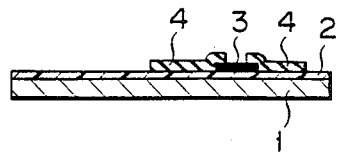

Thereafter, as seen from FIGS. 1D and 2D, a resinous metal paste is applied, for example, by printing means to fabricate electric circuit 4 involving the above-mentioned resinous electric resistance paste. Said resin-base metal paste is prepared, for example, from copper paste, Ag paste, gold paste or Ag/Pd paste. Said electric circuit 4 may be formed of a thin film prepared by thermally depositing or sputtering, for example, copper, aluminium, Ag, gold or nickel.

Figure 1E:
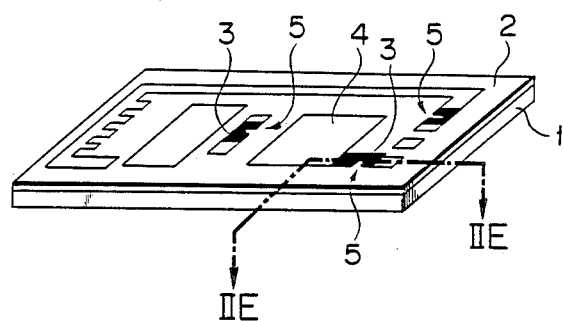
Figure 2E:
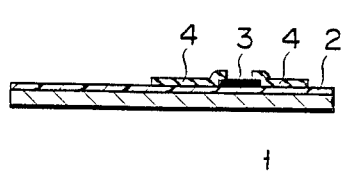
Figure 1F:
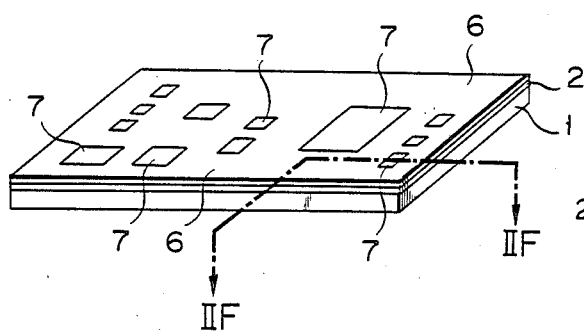
Figure 2F:
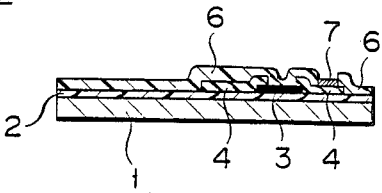
Figure 3:
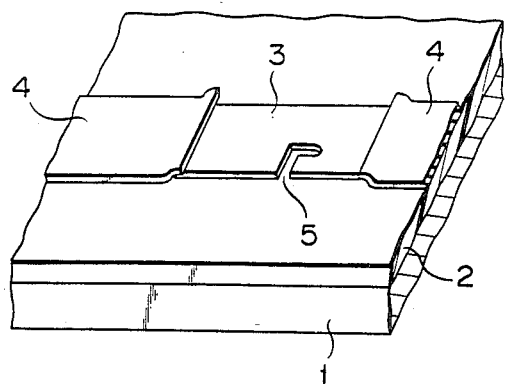
FIG. 3 is a fractional enlarged oblique view of part of FIG. 1E.

After the above-mentioned electric resistance paste and metal paste are applied, baking is carried out in an inert atmosphere consisting of, for example, $N_2$ to produce a printed resistor and electric circuit. Later, as represented by numeral 5 shown in FIGS. 1E, 2E and 3, laser trimming is carried out. On this occasion, laser beams reflect from the surface of insulating resinous composition 2 coated with a light-reflecting pigment prepared, for example, from white pigment, thereby enabling laser trimming to be undertaken without damaging the electric insulating resinous composition layer. Afterwards, as illustrated in FIGS. 1F and 2F, solder resist 6 is applied, for example, by printing with only the predetermined sections of electric wire 4 exposed. Later, nonelectrolytic plating is carried out to form metal layer 7. This process is intended to prevent the metal paste from being thinned by the applied solder, thereby increasing the soldered mechanical strength. Nonelectrolytic plating may be made, for example, with either Ni or Co. However, it is preferred to apply Ni plating which ensures quick reaction and excellent soldering effect.

EXAMPLE 1

A hard aluminium plate (JIS A2017) 2 mm thick was used as a metal substrate. The surface of said aluminum plate was subjected to blast grinding and then washed with trichlene. Insulating resin having a composition shown in Table 1 below was screen printed on one side of a metal substrate.

TABLE 1

| Components of insulating resin | Parts by weight |
| --- | --- |
| Thermosetting 1,2-polybutadiene resin | 100 |
| Hydrogenated polybutadiene resin | 15 |
| Colloidal silica (thixotropic agent) | 1 |
| Tetralin (solvent) | 5 |

The above-mentioned mixture was dried at 180° C. for 5 minutes, and hardened at 370° C. for 15 minutes in an atmosphere of nitrogen, producing an insulating resinous layer having a thickness of 140 microns. Copper paste (manufactured by Toshiba Co., Inc. under the trademark "Toshiba Chemical CT-221) was screen printed on said insulating resin. The copper paste was baked at 370° C. for 5 minutes in an atmosphere of nitrogen, providing a wire pattern. The metal core type print wire plate was tested to determine the adhesivity of the insulating resinous layer by means of a crosscut test (which was carried out by cutting up, for example, a wire pattern formed on the surface of the metal substrate in the form of a lattice 1 mm in mesh size, pasting a cellophane tape on said cut up wire pattern, and finally peeling off the cellophane tape). The test indicated such a numerical result as 100/100, this meaning that none of 100 lattice compartments were peeled off, namely, that said insulating resinous layer had an excellent adhesivity. A nickel-boron composite layer was nonelectrically plated on the copper pattern. A wire having a diameter of 0.6 mm was soldered to the above-mentioned mass. The electrode adhesivity was determined by an Instron tension tester, proving he adhesivity to be 1.5 to 20 kg/mm$^2$, a sufficiently great mechanical strength for practical application. Further, relative dielectric constant $\epsilon$ was determined to be 2.8 from the total capacitance of the electrode and metal substrate.

Control 1

Thermosetting 1,2-polybutadiene resin containing 3% by weight of hydrogenated polybutadiene was screen printed on a metal core substrate prepared from hard aluminum (JIS 2017). The screen printed substance was dried at 180° C. for 15 minutes and later hardened at 370° C. for 10 minutes in an atmosphere of nitrogen. At this time, cracks noticeably appeared in the hardened resin. When poked with a pair of tweezers, the cracked portions were easily stripped off.

Control 2

Thermosetting 1,2-polybutadiene resin containing 40% by weight of hydrogenated polybutadiene was screen printed on a metal core substrate prepared from aluminum having the same quality as that used in the example. The screen printed resin was hardened under the same condition as in Example 1. Thereafter resinous copper paste (having the same quality as in Example 1) was screen printed on the hardened mass. After plating a Ni-B composition, a wire having a diameter of 0.6 mm was soldered to the mass to carry out a tensility test, proving that the adhesivity mechanical strength was as low as 0.1 to 0.5 kg/mm$^2$, a considerably lower level than the practically useful level of 1.0 kg/mm$^2$.

EXAMPLE 2

An insulating resinous composition prepared from the components listed in Table 2 below was screen printed on one side of a metal substrate having the same quality as in Example 2.

| Components | Quantity (% by weight) |
|---|---|
| Thermosetting 1,2-polybutadiene (average molecular weight 3,000) | 100 |
| Hydrogenated polybutadiene resin | 15 |
| Colloidal slica | 1 |
| Titanium oxide powder (light-reflecting pigment) | 10 |
| Tetralin | 10 |

The screen printed mass was dried at 180° C. for five minutes, and then hardened at 370° C. for 15 minutes in an atmosphere of nitrogen, producing a white insulating film having a thickness of 140 microns. Carbonaceous electric resistance material was screen printed on the above-mentioned white insulating film. After 10-minute drying at 120° C., resinous copper paste (manufactured by Toshiba Chemical K.K. under the trademark "Chemitite CT-221") was printed on said screen-printed material. The printed material was baked at 370° C. for five minutes in an atmosphere of nitrogen. Later, laser trimming was carried out by means of a laser trimmer (manufactured by Toshiba under the trademark "LAY-711"), thereby adjusting the electric resistance of the laser trimmed mass to a predetermined level. Thereafter, solder resist was applied, and nonelectrolytic Ni-B plating was undertaken in a bath kept at 65° C. for 10 minutes after said solder resist was hardened.

The adhesivity of the insulating resinous layer to the metal core print wire board was determined by the cross cut test. No portion was stripped off as customarily indicated by the numerical formula 100/100. As microscopically observed, the laser-trimmed insulation layer presented no damages. Further during the withstand voltage test at AC 5kV×10 sec, no defective portion appeared as represented by the numerical formula 0/30 (which means that no defective portion was produced in 30 samples). Further, the Ni plating was uniformly deposited over the whole surface of the copper paste. Adhesivity mechanical strength was determined by soldering a wire having a diameter of 0.6 mm to the fabricated body. The test proved that the product indicated a mechanical strength of 2 kg/mm$^2$, thus presenting no practical difficulties.

When the total capacitance of the electrode and metal substrate was measured, the relative dielectric constant was found to be about 3.0, a lower level than was possible with the conventional substrate ($\epsilon$: 4 to 5) prepared from epoxy resin or phenolic resin.

Control 3

An electrically insulating resinous paste was applied on an aluminium substrate in the same manner as in Example 2, except that thermosetting 1,2-polybutadiene resin having an average molecular weight of 1000 was used. Later, electrically insulating resinous paste was deposited on the aluminium substrate.

The resinous paste was hardened under the same conditions as in Example 2, providing an insulating film having a thickness of 130 minutes. Later, resinous copper paste was screen printed on said insulating film. The screen printed material was baked at 370° C. for five minutes in an atmosphere of nitrogen. The mass was dipped in an Ni-B nonelectrolytic plating bath kept at 65° C. for 10 minutes. In this case, the copper pattern showed no plating reaction, indicating no crystallized Ni particles.

EXAMPLE 3

The surface of an aluminium substrate (A-2017) t=1.0 mm was subjected to polishing by #200 roll brush. After water washed, the substrate was dried at 180° C. for 30 minutes. Polybutadiene paste having the undermentioned composition (A) was printed on said substrate. The paste was thermally hardened in the air at 180° C. for 30 minutes. Another polybutadiene paste having the undermentioned composition (B) was printed and thermally hardened in the air at 180° C. for 30 minutes. The paste was baked at 350° C. for 10 minutes in an atmosphere of nitrogen. Both pastes respectively had thicknesses of 100 and 50 minutes. Wiring pattern was formed by printing a paste containing 94% by weight of copper powder having an average particle size of three minutes with phenoxy resin used as binder. The wire pattern was dried at 120° C. for 10 minutes, and baked at 350° C. for 10 minutes in an atmosphere of nitrogen. Nonelectrolyte Ni plating (plating material manufactured by Okuno Pharmocentical Mfg Co. under the trademark "Niclad 741") was applied to a part-carrying pad at 650° C. The relative dielectric constant of the insulating layer deposited on the substrate was determined by 1 MHz, giving a result of 2.8, a lower level than the relative dielectric constant of 4.8 obtained from the conventional substrate (for example, epoxy resin). A wire having a diameter of 0.6 mm and surrounded with a land having a diameter of 1.3 mm was soldered to a pad measuring 2×2 mm. The tensile strength of the wire-bonded pad was determined at a speed of 0.5 cm/min by the Instron tension tester, indicating a tensile strength of 2 kg/mm$^2$, a level sufficiently strong for practical application.

| Composition of Polybutadiene | |
|---|---|
| Components | Quantity (parts by weight) |
| A grade | |
| Thermosetting 1,2-polybutadiene resin | 100 |
| Hydrogenated polybutadiene resin | 20 |
| Alumina powder (average particle size: 2 microns) | 50 |

-continued

Composition of Polybutadiene

| Components | Quantity (parts by weight) |
| --- | --- |
| $TiO_2$ powder | 10 |
| Colloidal silica | 1 |
| B grade | |
| Thermosetting 1,2-polybutadiene resin | 100 |
| TiO powder | 30 |
| Colloidal silica | 1 |

What is claimed is:

1. A wiring substrate comprising a wiring circuit formed on a metal substrate with an insulating resinous layer interposed therebetween, wherein said insulating resinous layer is formed of a high molecular composition comprising thermosetting 1,2-polybutadiene containing 5 to 30% by weight (based on the whole mass of the resinous layer) of high molecular softening agent.

2. The wiring substrate according to claim 1, wherein the high molecular softening agent is hydrogenated polybutadiene or atactic polypropylene resin.

3. The wiring substrate according to claim 1, wherein the high molecular softening agent is one selected from the group consisting of chlorinated polyethylene, ethylene-vinyl acetate copolymer, and vinyl acetate.

4. The wiring substrate according to claim 1, wherein the thermosetting 1,2-polybutadiene resin has an average molecular weight of 1700 to 3300.

5. The wiring substrate according to claim 1, wherein the metal substrate is prepared from aluminium.

6. The wiring substrate according to claim 1, wherein the insulating resinous layer further contains light-reflecting pigment.

7. The wiring substrate according to claim 1, wherein the insulating resinous layer further contains thixotropic agent.

8. The wiring substrate according to claim 1, wherein the insulating resinous layer further contains a solvent.

9. The wiring substrate according to claim 1, wherein the insulating resinous layer has a lower relative dielectric constant than 3.

10. The wiring substrate according to claim 1, which further comprises another insulating resinous layer interposed between said wiring circuit and said insulating resinous layer, said another insulating resinous layer comprising thermosetting 1,2-polybutadiene and containing no softening agent.

* * * * *